United States Patent [19]

Naokawa

[11] 4,199,725
[45] Apr. 22, 1980

[54] FM RECEIVER MUTING RANGE SETTING CIRCUIT

[75] Inventor: Toyoziro Naokawa, Sakado, Japan
[73] Assignee: Toko, Inc., Tokyo, Japan
[21] Appl. No.: 955,747
[22] Filed: Oct. 30, 1978
[30] Foreign Application Priority Data
  Oct. 28, 1977 [JP] Japan ................................. 52-129340
[51] Int. Cl.² .............................................. H04B 1/10
[52] U.S. Cl. ...................................... 455/212; 455/218
[58] Field of Search ............... 325/346, 348, 402, 403, 325/456, 478; 328/165, 146, 147; 307/303, 362

[56] References Cited
U.S. PATENT DOCUMENTS

| | | | |
|---|---|---|---|
| 2,513,786 | 7/1950 | Crosby | 325/456 |
| 2,589,711 | 3/1952 | Lacy | 325/348 |
| 2,844,713 | 7/1958 | Zuckerman | 325/348 |
| 3,569,633 | 3/1971 | Brahman | 325/348 |

Primary Examiner—Marc E. Bookbinder
Assistant Examiner—Alexander Gerasimow
Attorney, Agent, or Firm—Sughrue, Rothwell, Mion, Zinn and Macpeak

[57] ABSTRACT

A muting range setting circuit for an FM receiver uses a pair of differential amplifiers. Each of the differential amplifiers employs the same transistors having like polarity with common input and output terminals. The output of the tuner AFC is compared with an input reference voltage in the differential amplifier circuit and the output representing the frequency deviation of the FM detecting circuit is applied to the gate driving circuit for control of the muting operation.

7 Claims, 3 Drawing Figures

FM RECEIVER MUTING RANGE SETTING CIRCUIT

BACKGROUND OF THE INVENTION

This invention relates to a muting circuit for an FM receiver for relieving adjacent-channel interference produced by local noises during channel selection. More particularly, it relates to a muting range setting circuit in the muting circuit for setting a muting range in which a muting operation is effectuated.

FIG. 1 shows a block diagram illustrating one example of a normally used muting circuit with accompanying circuits. In that Figure, an FM detecting circuit 1 is shown having a function to be described later. Although an antenna, a front end section, an intermediate frequency amplifier (hereinafter referred to merely as IF amplifier when applicable) and the like are not represented in FIG. 1, in an FM receiver, an FM signal received by the antenna is applied to the front end section where it is tuned to a particular broadcast frequency which is in turn converted into an intermediate frequency signal (hereinafter referred to merely as an IF signal when applicable) of 10.7 MHz. These are all standard components to such tuner sections.

This IF signal is applied to the FM detecting circuit 1 through the IF amplifier. In the situation when the input signal of the FM detecting circuit 1, which is delivered from the IF amplifier, deviates from the intermediate frequency of 10.7 MHz, the D.C. output signal of the FM detecting circuit 1 varies in response to the frequency deviation therefrom. The D.C. output signal is a so-called "S curve voltage signal". This output is fed through an AFC circuit 2 to a muting range setting circuit 4 where a muting range in which a muting operation is accomplished, is set. The output of the muting range setting circuit 4 is fed to a gate driving circuit 5. This constitutes a muting driving circuit together with the AFC circuit 2, the muting range setting circuit 4 and a gate circuit 7, to control the operation of a low-frequency amplifier 3. In addition, a D.C. reference voltage source 6 constitutes a part of the muting circuit together with the above described muting driving circuit.

In the muting circuit of the conventional FM receiver, a muting range setting circuit comprises NPN transistors and PNP transistors. In many situations, both the NPN transistors and the PNP transistors are integrated on a common substrate. As a result of this manufacturing step, transistors provided at one side of the substrate are formed as a lateral structure, thereby resulting in decreasing of current amplification factor in each transistor.

Generally, the current amplification factor in a PNP transistor becomes lower than that in the NPN transistor which is formed on the substrate as a planar structure. In order to improve the current amplification factor, it has been proposed to form the PNP and NPN transistors as a composite transistor on the substrate. This composite transistor can be obtained by connecting the transistors in Darlington arrangement. In this case, however, there is a possibility that the muting range may be set unsymmetrically with respect to the intermediate frequency of 10.7 MHz due to the difference in current amplification factor. Furthermore, since the outputs of the respective NPN and PNP transistors have opposite polarities to each other, the conventional muting range setting circuit is disadvantageous in that it is necessary to deliver the outputs of the respective transistors to the gate driving circuit independently. As a result, the circuit becomes overly complicated in construction.

SUMMARY OF THE INVENTION

Accordingly, an object of the present invention is to eliminate the above drawbacks by providing an improved muting range setting circuit for an FM receiver wherein a pair of differential amplifiers which are composed of the same transistors in their polarities, have common input and output terminals.

It is another object of the present invention to provide for a simple muting range setting circuit that is highly reliable and easily fabricated.

These and other objects of the present invention will be described with respect to the preferred embodiment that follows.

DETAILED DESCRIPTION OF THE PREFERRED EMBODIMENT

One preffered example of the present muting range setting circuit will be described with reference to FIGS. 2 and 3.

Figure 1:
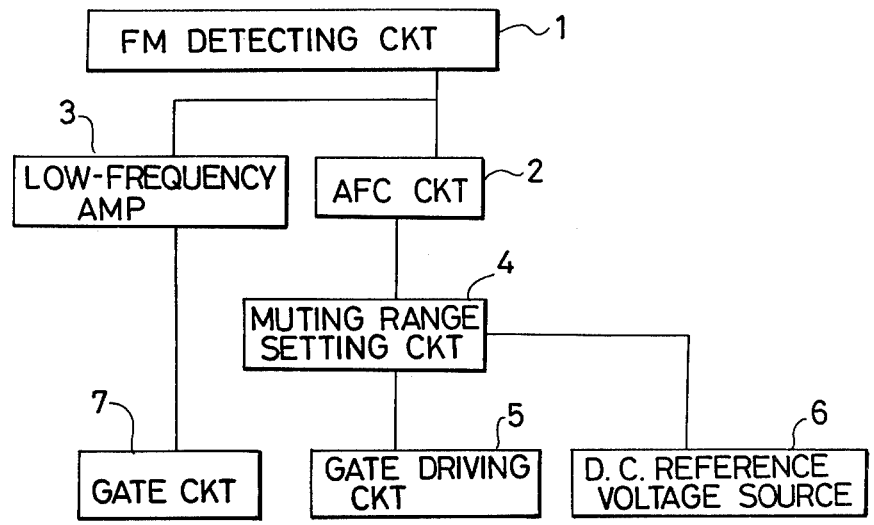
FIG. 1 is a block diagram showing one example of a conventional muting circuit for an FM receiver with accompanying circuits.
Figure 2:
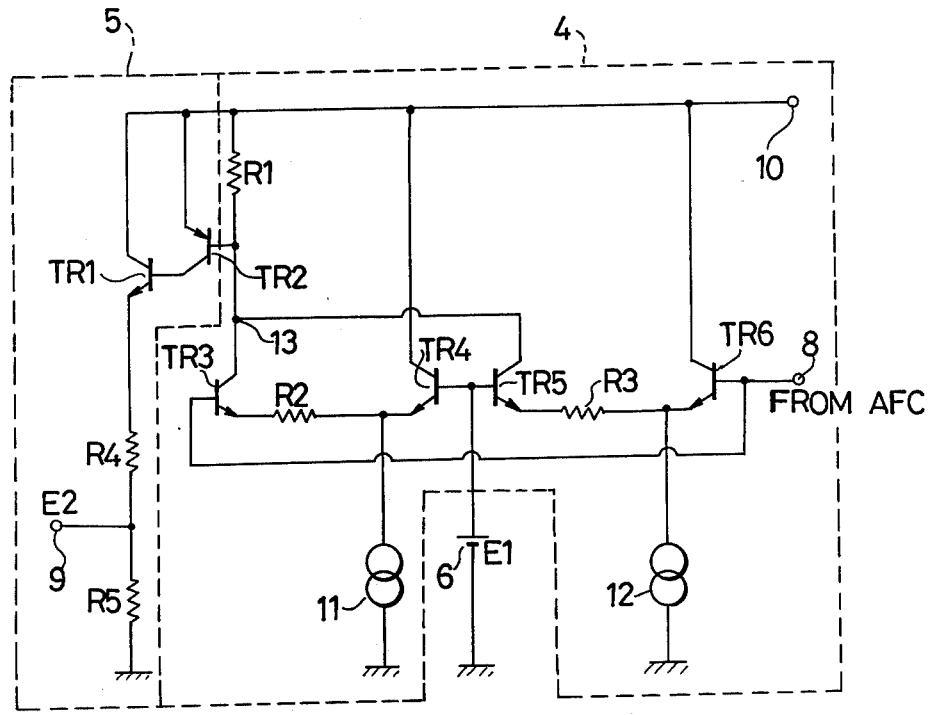
FIG. 2 is a schematic circuit diagram showing one example of a muting range setting circuit according to this invention.

In FIG. 2, there is shown a muting range setting circuit 4 and a part of a well known muting driving circuit corresponding to a gate driving circuit 5 and a D.C. reference voltage source 6 as shown in FIG. 1. The muting range setting circuit 4 comprises a first differential amplifier comprising NPN transistors $TR_3$ and $TR_4$ and a resistor $R_2$ and a second differential amplifier comprising NPN transistors $TR_5$ and $TR_6$ and a resistor $R_3$. Constant current sources 11 and 12 and a load resistor $R_1$ are coupled as shown. NPN transistors $TR_3$ and $TR_4$ have their emitters connected to each other through the resistor $R_2$, and NPN transistors $TR_5$ and $TR_6$ have their emitters connected to each other through the resistor $R_3$. The constant current sources 11 and 12 are connected to the junctions between the emitter of transistor $TR_4$ and the resistor $R_2$ and between the emitter of transistor $TR_6$ and the resistor $R_3$, respectively. The bases of transistors $TR_4$ and $TR_5$ are connected to the reference D.C. power source 6 in common and the common reference D.C. power source 6 is maintained at a common reference voltage $E_1$. The collectors of transistors $TR_3$ and $TR_5$ are connected to a common output terminal 13 of the both the first and the second differential amplifiers. The output terminal 13 is connected through the load resistor $R_1$ to a terminal 10 to which a collector power source is supplied. The bases of transistors $TR_3$ and $TR_6$ are connected to a common input terminal 8 of both the first and the second differential amplifiers. In addition, the collectors of transistors $TR_4$ and $TR_6$ are connected in common to the terminal 10.

The output terminal 13 is connected to the base of a PNP transistor $TR_2$ in the gate driving circuit 5. The collector of transistor $TR_2$ is connected to the base of an NPN transistor $TR_1$, whereas the emitter of the transistor $TR_2$ is connected to terminal 10 together with the collector of NPN transistor $TR_1$. The emitter of transistor $TR_1$ is grounded through resistors $R_4$ and $R_5$.

In operation, the output of an AFC circuit 2 shown in FIG. 1 is applied to the common input terminal 8. As shown in FIG. 3, this output of the AFC circuit 2 exhibits an S curve voltage variation in accordance with frequency deviation with respect to an intermediate frequency $f_0$ of 10.7 MHz. The output voltage of the AFC circuit corresponding to the intermediate frequency $f_0$ is equal to a reference voltage $E_1$ which is applied to both bases of transistors $TR_4$ and $TR_5$ by a D.C. reference power source, 6.

In this case, since the base voltages of the transistors $TR_3$ through $TR_6$ are equal to each other, in the differential amplifiers currents flow through the transistors $TR_4$ and $TR_6$ the emitters of which are directly connected to the constant current source 11 and 12, respectively. Accordingly, no output from the differential amplifiers will appear at the output terminal 13.

In the case when the output frequency of an FM detecting circuit 1 shown in FIG. 1 deviates from the intermediate frequency $f_0$ toward a frequency range higher than the intermediate frequency $f_0$, the output voltage of the AFC circuit 2 corresponding to the higher frequency, higher than the reference voltage $E_1$ from source 6, is applied to the common input terminal 8. As a result, the base voltage of the transistor $TR_3$ becomes higher than that of the transistor $TR_4$. Accordingly, current also flows through the transistor $TR_3$.

By contrast, in the case when the output frequency of the FM detecting circuit 1 deviates from the intermediate frequency $f_0$ toward a frequency range lower than the intermediate frequency $f_0$, the output voltage of the AFC circuit 2 corresponding to the lower frequency, lower than the reference voltage $E_1$, is applied to the common input terminal 8. As a result, the base voltage of the transistor $TR_5$ is higher than that of the transistor $TR_6$. Accordingly, current also flows through the transistor $TR_5$. The above mentioned current value is dependent on the respective resistance values of the load resistor $R_1$, the resistors $R_2$ and $R_3$, and the respective current values of the constant current sources 11 and 12. The output corresponding to the D.C. voltage of the AFC circuit which is representative of the frequency deviation of the FM detection circuit 1, appears at the output terminal 13. When the constant current sources 11 and 12 are equal in current value to each other, under an assumption that the resistance value of the load resistors $R_1$ is $R_1'$, the resistance value of the resistor $R_2$ is $R_2'$ and the resistance value of the resistor $R_3$ is $R_3'$, as the values defined by $R_1'/R_2'$ and $R_1'/R_3'$ increase, the amplification of the difference between the output voltage of the AFC circuit 2 applied to the input terminal 8 and the reference voltage $E_1$ can be increased.

This output from the output terminal 13 is applied to the base of the transistor $TR_2$ in the gate driving circuit 5, so that when the output reaches a threshold voltage level, the transistor $TR_2$ is rendered conductive to start a muting operation.

The transistor $TR_1$ is rendered conductive when the transistor $TR_2$ is put in an operative state, and then an output voltage $E_2$ divided by resistors $R_4$ and $R_5$ appears at an output terminal 9. The output voltage $E_2$ is applied to the gate circuit 7 shown in FIG. 1, so that the gate circuit 7 could control the operation of the low-frequency circuit 3 in response to the output voltage $E_2$.

Figure 3:
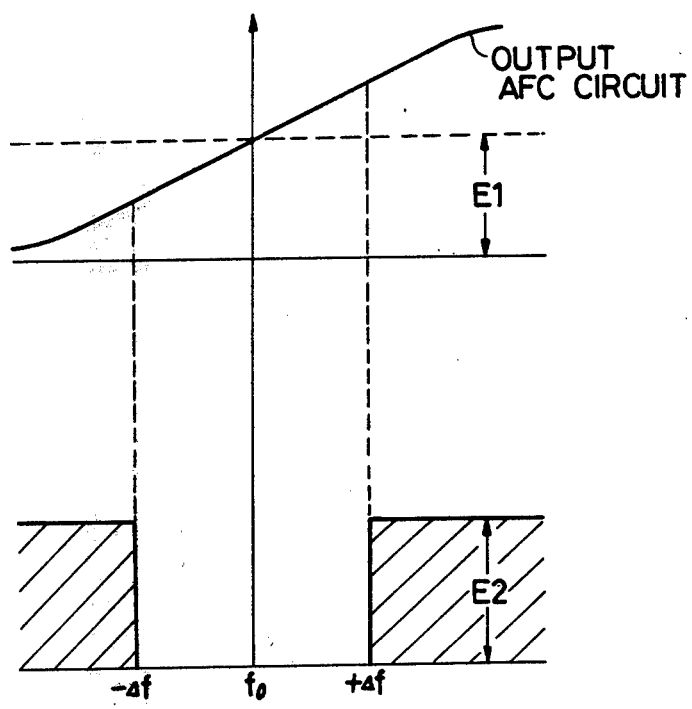
FIG. 3 is a graphical representation for a description of an operation of the present muting range setting circuit.

Accordingly, it is clear that the threshold levels $+\Delta f$ and $-\Delta f$ can be attained by selecting the values of $R_1'/R_2'$ and $R_1'/R_3'$, so that they define muting ranges as indicated by hatched portions in FIG. 3 and define a band pass range. The differential amplifiers should be equal to each other in their characteristics in order to make the absolute values of $+\Delta f$ and $-\Delta f$ equal to each other. But since the transistors employed in the present invention are almost equal in their current amplification factor to each other, the resistance values $R_1'$ and $R_3'$ become almost equal to each other in their resistance.

Furthermore, in the case where only the resistance values $R_2'$ and $R_3'$ of the resistors $R_2$ and $R_3$ are decreased to thereby excessively increase the values of $R_1'/R_2'$ and $R_{1'}/R_{3'}$, the absolute values of the frequency deviations $+\Delta f$ and $-\Delta f$ become excessively small. As a result, there is a possibility that undesired muting operation may occur in the vicinity of the intermediate frequency. On the contrary, in case of decrease in the resistance values $R_2'$ and $R_3'$ together with $R_1$40, it may be possible to make the resistance values $R_2'$ and $R_3$ nearly zero. Therefore, the noise signal in the frequency ranges more than $+\Delta f$ or less than $-\Delta f$ are positively eliminated.

As is apparent from the above description, the muting range setting circuit 4 of the present invention comprises four transistors equal in polarity to each other. Accordingly, where the muting range setting circuit is produced as an integrated circuit, it is possible to form the transistors as the planar structure with simple manufacturing steps. As a result, the difference in current amplification factor and threshold voltage level across the base and the emitter of a transistor among the respective transistors contained in the muting range setting circuit can be eliminated. In addition, it is unnecessary to take the inherent difference between an NPN transistor and a PNP transistor such as switching speed into consideration.

According to the present invention, there is no need to provide a complicated circuit including composite transistors. It is possible to eliminate drawbacks accompanying conventional muting range setting circuits such as a muting range set unsymmetrically with respect to the intermediate frequency $f_0$ due to difference in absolute values of frequency deviations $+\Delta f$ and $-\Delta f$ from the intermediate frequency $f_0$.

It is apparent that other modifications and variations of this invention are possible without departing from the essential scope of the invention.

What is claimed is:

1. In a muting range setting circuit for an FM receiver having an FM detecting circuit and an AFC circuit providing an input to said muting range setting circuit, said setting circuit delivering an output to a gate driving circuit to define and accomplish signal muting operation within a frequency range, the improvement comprising: a pair of differential amplifiers having common input and output terminals in the same polarity and means to establish a reference voltage for said pair of differential amplifiers, wherein the output of said AFC circuit is compared to said reference voltage and said setting circuit delivering an output indicative of the frequency deviation of said FM detecting circuit to selectively initiate muting operation.

2. The muting range setting circuit of claim 1, wherein each differential amplifier comprises a pair of NPN transistors.

3. The muting range setting circuit of claim 2, wherein said means to establish a reference voltage comprises a D.C. source coupled to the bases of the first of each transistor in said pair of transistors.

4. The muting range setting circuit of claims 2 or 3, wherein the emitters of the first and second transistors in each pair are coupled to each other through a resistor, and wherein the collector of the first transistor in one of said pairs and the collector of the second transistor in the other pair is coupled to a common output terminal.

5. The muting range setting circuit of claim 4, wherein the input from said AFC circuit is coupled to the bases of the second transistors in each pair.

6. The muting range setting circuit of claim 5, wherein said circuit is formed as an integrated circuit.

7. The muting range setting circuit of claims 1, 2 or 3, wherein said circuit is formed as an integrated circuit.

* * * * *